United States Patent
Barnes et al.

(10) Patent No.: US 12,068,732 B2
(45) Date of Patent: Aug. 20, 2024

(54) NOISE MITIGATION CIRCUITRY FOR QUANTUM COMPUTERS AND CORRESPONDING METHODS

(71) Applicant: Quantinuum LLC, Broomfield, CO (US)

(72) Inventors: Corey Andrew Barnes, Lafayette, CO (US); James Knodel, Broomfield, CO (US); Joshua Giles, Arvada, CO (US); Matthew Swallows, Lafayette, CO (US); Jeremy S. Parks, Westminster, CO (US); Jason Dominy, Superior, CO (US); Leonardo I. Ascarrunz, Lafayette, CO (US); David James Francois, Broomfield, CO (US); Adam P. Reed, Broomfield, CO (US); Maya Fabrikant, Broomfield, CO (US)

(73) Assignee: QUANTINUUM LLC, Broomfield, CO (US)

( * ) Notice: Subject to any disclaimer, the term of this patent is extended or adjusted under 35 U.S.C. 154(b) by 346 days.

(21) Appl. No.: 17/553,206

(22) Filed: Dec. 16, 2021

(65) Prior Publication Data
US 2022/0247386 A1 Aug. 4, 2022

Related U.S. Application Data

(60) Provisional application No. 63/145,039, filed on Feb. 3, 2021.

(51) Int. Cl.
*H03H 11/04* (2006.01)
*G06N 10/40* (2022.01)
*H03H 7/01* (2006.01)

(52) U.S. Cl.
CPC ............ *H03H 11/04* (2013.01); *G06N 10/40* (2022.01); *H03H 7/01* (2013.01)

(58) Field of Classification Search
CPC .......... H03H 11/04; H03H 7/01; G06N 10/40
See application file for complete search history.

(56) References Cited

U.S. PATENT DOCUMENTS

| 11,025,228 B1 | 6/2021 | Ascarrunz et al. |
| 2019/0214949 A1* | 7/2019 | Hudek ...................... H03F 1/52 |

(Continued)

OTHER PUBLICATIONS

Chacko, George Gibin, et al., "Characteristics of Arbitrary Ramp Generator: A Tuning Voltage Setup for the FMCW Reflectometer", IEEE Transactions on Instrumentation and Measurement, Jun. 2020, vol. 69, No. 6, pp. 3481-3492, IEEE, US.

(Continued)

*Primary Examiner* — Nicole M Ippolito
(74) *Attorney, Agent, or Firm* — ALSTON & BIRD LLP

(57) ABSTRACT

Various embodiments provide methods, apparatuses, systems, or computer program products for providing a signal to an electrode of a quantum computer. In an example embodiment, the system comprises noise mitigation circuitry comprising a signal generator, a gain stage, and a filter stage. The signal generator may be comprised of a plurality of voltage sources. The controller causes the signal generator to generate a signal, and the signal is provided to the electrode through the noise mitigation circuitry to cause at least a portion of the system to perform a function.

20 Claims, 11 Drawing Sheets

(56) References Cited

U.S. PATENT DOCUMENTS

2020/0301241 A1* 9/2020 Duan .................. G02F 1/33
2023/0054368 A1* 2/2023 Li .................. H03M 1/822

OTHER PUBLICATIONS

Extended European search report Mailed on Jul. 12, 2022 for EP Application No. 22154990, 10 pages.

Johnson, K.G., et al. "Active stabilization of ion trap radiofrequency potentials", Review of Scientific Instruments, May 12, 2016, vol. 87, No. 053110, retrieved from the Internet <http://aip.scitation.org/doi/pdf/10.1063/1.4948734> on Jun. 24, 2022, 6 pages.

Park, Yunjae, et al., "A Feedback Control Method to Maintain the Amplitude of the RF Signal Applied to Ion Traps", Applied Sciences, Jan. 17, 2021, vol. 11, No. 837, retrieved from the Internet: <https://www.mdpi.com/2076-3417/11/2/83 7/pdf?version=1611314672&> on Jun. 27, 2022, 10 pages.

Pogorelov, I., et al., "A compact ion-trap quantum computing demonstrator", PRX Quantum, Jun. 17, 2021, vol. 2, No. 020343, retrieved from the Internet at <https://arxiv.org/pdf/2101.11390v1.pdf> submitted on Jan. 27, 2021, 22 pages.

Stuart, J., et al., "Chip-Integrated Voltage Sources for Control of Trapped Ions", Physical Review Applied, Feb. 5, 2019, vol. 11, retreived from the Internet at <https://arxiv.org/pdf/1810.07152.pdf> on Aug. 17, 2022, 7 pages.

* cited by examiner

NOISE MITIGATION CIRCUITRY FOR QUANTUM COMPUTERS AND CORRESPONDING METHODS

CROSS-REFERENCE TO RELATED APPLICATIONS

This application claims the benefit of U.S. Provisional Patent Application No. 63/145,039, which was filed on Feb. 3, 2021, the entire contents of which are incorporated by reference herein for all purposes.

TECHNICAL FIELD

Various embodiments relate to apparatuses, systems, and methods for mitigating signal noise in quantum computers. For example, some example embodiments relate to the use of signal generators, including dual voltage sources, and/or filtering comprising active and passive filters to mitigate the noise of a signal applied to an electrode of an ion trap.

BACKGROUND

In various scenarios, a quantum computing system having electrical components may be configured to perform multiple functions, and different functions may have different tolerances. These tolerances may include the amount of the noise present in the signals that are applied to various electrical components and/or the amount of heat that may be added by the signals to the electrical components. For example, an ion trap can use a combination of electrical and magnetic fields to capture a plurality of ions in a potential well. Various functions may be performed to cause the ions to move in particular ways through portions of the ion trap and/or be contained in a particular portion of the ion trap. These various functions may have differing noise tolerances in the signals used to generate the combination of electrical and magnetic fields and/or heat tolerances for the electrical components. Additionally, the electrical circuitry used to generate the signals may include circuitry components that cause heat to be added to the ions. Through applied effort, ingenuity, and innovation, many deficiencies of such prior ion traps have been solved by developing solutions that are structured in accordance with the embodiments of the present invention, many examples of which are described in detail herein.

BRIEF SUMMARY OF EXAMPLE EMBODIMENTS

Example embodiments provide systems, methods, apparatuses, computer program products and/or the like for quantum computers, particularly noise mitigation for quantum computers.

Various embodiments provide for a system providing a signal to an electrode in an ion trap of a quantum computer. In various embodiments, the system may be comprised of a signal generator, a gain stage, a filter stage, and/or a converter. In various embodiments, a signal generator may be configured to generate a first signal, wherein the first signal comprises a frequency sweep. In various embodiments, a gain stage may be configured to amplify the signal, wherein an input to the gain stage is connected to the output of the signal generator. In various embodiments, a filter stage may be configured to filter the signal, where an input to the filter stage is connected to an output of the gain stage. A converter may be further configured to measure a response at an output of the filter stage in response to the first signal. A signal generator may be further configured to generate a second signal, wherein the second signal is pre-distorted with a determined pre-distorted waveform based on the response measured. In various embodiments, an electrode in an ion trap is configured to receive the second signal.

In various embodiments, the filter stage comprises an active filter and a passive filter.

In various embodiments, the signal generator comprises a first digital-to-analog converter and a second digital-to-analog converter.

In various embodiments, the second digital-to-analog converter is configured to provide a DC offset voltage.

In various embodiments, the first digital-to-analog converter is configured to provide the pre-distorted second signal.

In various embodiments, the output of the signal generator connected to the input of the gain stage is connected through a switch, and wherein the switch switches between connecting to the input of the gain stage and connecting to the converter.

In various embodiments, the filter stage comprises a low pass filter.

In various embodiments, the filter stage comprises a filter having a Butterworth response.

In various embodiments, the ion trap is configured to have a plurality of ions trapped therein, and wherein at least some of the plurality of the ions trapped therein are used as qubits of the quantum computer.

Various embodiments provide for a method for pre-distorting a signal generated by a signal generator of a quantum computer. In various embodiments, the method comprises causing, by a controller, a signal generator to generate a first signal, wherein the first signal comprises a frequency sweep over a plurality of frequencies. The method further comprises causing the first signal to be provided to noise mitigation circuitry, wherein the noise mitigation circuitry comprises a filter stage, and wherein the filter stage is configured to filter the first signal in accordance with a filter response to provide a filtered signal. The method further comprises measuring the filtered signal with a converter; causing the signal generator to generate a second signal, wherein the second signal is pre-distorted based on the measurement of the filtered signal. The method further comprises causing the second signal to be provided to an electrode of an ion trap of the quantum computer.

Various embodiments provide for a method providing a signal from a signal generator of a quantum computer. In various embodiments, the method comprises causing, by a controller, a first switch to be in a first position, wherein the first switch comprises an input and at least a first output and a second output, wherein the first position corresponds to the first output, wherein a second position corresponds to the second output, wherein the first output of the first switch is connected to a converter, wherein the second output of the first switch is connected to an input of a gain stage, wherein the gain stage comprises an output, wherein the output of the gain stage is connected to an input of a filter stage, wherein an output of the filter stage is connected to the converter. The method further comprises causing, by a controller, the signal generator to generate a first signal to be provided to the first switch, wherein the first signal comprises a frequency sweep or a pulse. The method further comprises measuring a first response from the generation of the first signal at the converter. The method further comprises causing the first switch to be in the second position. The method further comprises causing the signal generator to generate a second signal to be provided to the first switch in the second position, wherein the second signal comprises a frequency sweep or pulse. The method further comprises measuring a second response from the generation of the second signal at the converter. The method further comprises determining a frequency response based on the measurement of the first response and the measurement of the second response. The method further comprises causing the signal generator to generate a third signal based on the frequency response, wherein the third signal is pre-distorted based on the frequency response. The method further comprises causing the third signal to be provided to an electrode of an ion trap of the quantum computer.

Various embodiments provide for a method for providing a signal from a signal generator of a quantum computer for a time-domain reflectometry measurement. In various embodiments, the method comprises causing a first switch to be in a first position of the first switch, wherein the first switch comprises an input of the first switch and at least a first output of the first switch and a second output of the first switch, wherein the first position of the first switch corresponds to the first output of the first switch and a second position of the first switch corresponds to the second output of the first switch. The method further comprises causing a second switch to be in a first position of the second switch, wherein the second switch comprises at least a first input of the second switch and a second input of the second switch and an output of the second switch, wherein the first position of the second switch corresponds to the first input of the second switch and a second position of the second switch corresponds to the second output of the second switch. In various embodiments, the first output of the first switch is connected to the first input of the second switch. In various embodiments, the second output of the first switch is connected to an input of a gain stage, wherein the gain stage comprises an output, wherein the output of the gain stage is connected to an input of a filter stage, wherein an output of the filter stage is connected to the second input of the second switch; and wherein the output of the second switch is connected to an ion-trap of the quantum computer. The method further comprises causing, by a controller, a signal generator to generate a first signal, wherein the first signal comprises a pulse. The method further comprises measuring a first response with a converter at the output of the second switch from the generation of the first signal, wherein measurement of the first response comprises a time-domain reflectometry measurement.

Various embodiments provide for a method for providing a signal from a signal generator of a quantum computer for a time-domain reflectometry measurement. In some embodiments, the method comprises causing a first switch to be in a second position of the first switch, wherein the first switch comprises an input of the first switch and at least a first output of the first switch and a second output of the first switch, wherein a first position of the first switch corresponds to the first output of the first switch and the second position of the first switch corresponds to the second output of the first switch. The method further comprises causing a second switch to be in a second position of the second switch, wherein the second switch comprises at least a first input of the second switch and a second input of the second switch and an output of the second switch, wherein a first position of the second switch corresponds to a first input of the second switch and the second position of the second switch corresponds to the second output of the second switch. In various embodiments, the first output of the first switch is connected to the first input of the second switch. In various embodiments, the second output of the first switch is connected to an input of a gain stage, wherein the gain stage comprises an output, wherein the output of the gain stage is connected to an input of a filter stage, wherein an output of the filter stage is connected to the second input of the second switch; and wherein the output of the second switch is connected to an ion-trap of the quantum computer. The method further comprises causing, by a controller, a signal generator to generate a first signal, wherein the first signal comprises a pulse. The method further comprises measuring a first response with a converter at the output of the second switch from the generation of the first signal, wherein measurement of the first response comprises a time-domain reflectometry measurement.

Various embodiments provide for a method for providing a signal from a signal generator of a quantum computer for a noise spectral density measurement. In various embodiments, the method comprises causing a first switch to be in a first position of the first switch, wherein the first switch comprises an input of the first switch and at least a first output of the first switch and a second output of the first switch, wherein a first position of the first switch corresponds to the first output of the first switch and the second position of the first switch corresponds to the second output of the first switch. In various embodiments, the first output of the first switch is connected to a converter. In various embodiments, the second output of the first switch is connected to an input of a gain stage, wherein the gain stage comprises an output, wherein the output of the gain stage is connected to an input of a filter stage, wherein an output of the filter stage is connected to a second switch, and wherein the second switch comprises an input and a first output and a second output, wherein the first output of the second switch is connected to an ion-trap of the quantum computer and the second output of the second switch is connected to the converter. The method further comprises causing, by a controller, a signal generator to generate a first signal, wherein the first signal comprises a DC voltage. The method further comprises measuring a first response with the converter, wherein measurement of the first response comprises a noise spectral density measurement.

In various embodiments the method further comprises measuring, by a converter, the noise spectral density of an electrode in an ion trap, wherein an input to the converter is connected to an output of a gain stage, wherein an input to the gain stage is connected to an electrode in an ion trap.

In various embodiments, the electrode is configured to have a plurality of ions trapped therein, and wherein at least some of the plurality of the ions trapped therein are used as qubits of the quantum computer.

Various embodiments provide for a system for providing a signal to an electrode in an ion trap. In various embodiments, the system comprises a signal generator comprised of a waveform generator, a converter, and a switch. In various embodiments, the waveform generator is configured to generate a waveform signal. In various embodiments, wherein the converter is a digital-to-analog converter and is configured to generate a DC signal. In various embodiments, the switch has a first input of the switch connected to the output of the waveform generator, a second input of the switch connected to the output of the converter, and an output of the switch. In various embodiments, the signal generator is configured to cause the switch to transition between the first input and the second input to combine the waveform signal and the DC signal at the output of the signal generator to generate a combined signal. The system further comprises a gain stage configured to amplify the combined signal, wherein an input of the gain stage is connected to the output of the switch. The system further comprises an ion trap connected to the output of the gain stage, wherein the ion trap comprises at least one electrode, and wherein the at least one electrode is connected to the output of the gain stage.

Various embodiments provide for a system for providing a signal to an electrode in an ion trap, and in various embodiments the system comprises a signal generator configured to generate a first signal, wherein the first signal comprises a frequency sweep. The system further comprises a gain stage configured to amplify the first signal, wherein an input to the gain stage is connected to the output of the signal generator. The system further comprises a filter stage configured to filter the first signal, where an input to the filter stage is connected to an output of the gain stage. The system further comprises a converter configured to measure a response at an output of the filter stage in response to the first signal. In various embodiments, the signal generator is further configured to generate a second signal, wherein the second signal is pre-distorted based on a measured response of the first signal; In various embodiments, the electrode in the ion trap is configured to receive the second signal.

Various embodiments provide for a system for providing a signal to an electrode in an ion trap, and in various embodiments the system comprises a signal generator configured to generate a first signal, wherein the first signal comprises a frequency sweep. The system further comprises a gain stage configured to amplify the first signal, wherein an input to the gain stage is connected to the output of the signal generator. The system further comprises a filter stage configured to filter the first signal, where an input to the filter stage is connected to an output of the gain stage. The system further comprises a sample stage, where an input to the sample stage is connected to the output of the filter stage. The system further comprises a converter configured to measure a response at an output of the sample stage in response to the first signal. In various embodiments, the signal generator is further configured to generate a second signal, wherein the second signal is pre-distorted based on a measured response of the first signal; In various embodiments, the electrode in the ion trap is configured to receive the second signal.

Various embodiments provide for a system for providing a signal to an electrode in an ion trap, and in various embodiments the system comprises a signal generator configured to generate a first signal, wherein the first signal comprises a frequency sweep. The system further comprises a gain stage configured to amplify the first signal, wherein an input to the gain stage is connected to the output of the signal generator. The system further comprises a filter stage configured to filter the first signal, where an input to the filter stage is connected to an output of the gain stage. The system further comprises a converter configured to measure a response at an output of the filter stage in response to the first signal. The system further comprises wherein the signal generator is further configured to generate a second signal, wherein the second signal is pre-distorted based on a measured response of the first signal. In various embodiments, the electrode in the ion trap is configured to receive the second signal.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

DETAILED DESCRIPTION OF SOME EXAMPLE EMBODIMENTS

Figure 1:
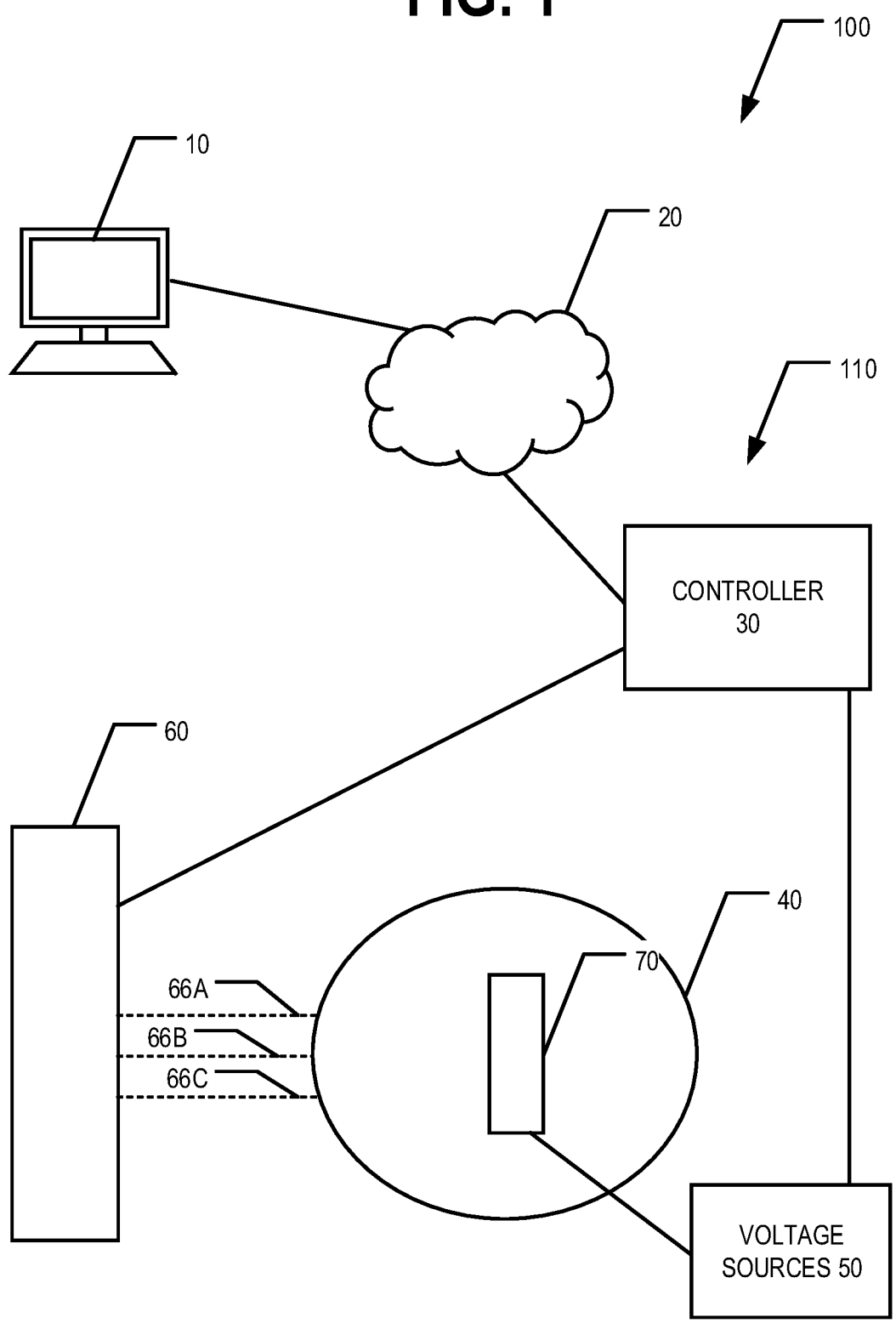
FIG. 1 is a schematic diagram of an example quantum computing system according to various embodiments.

The present invention now will be described more fully hereinafter with reference to the accompanying drawings, in which some, but not all embodiments of the invention are shown. Indeed, the invention may be embodied in many different forms and should not be construed as limited to the embodiments set forth herein; rather, these embodiments are provided so that this disclosure will satisfy applicable legal requirements. The term "or" (also denoted "/") is used herein in both the alternative and conjunctive sense, unless otherwise indicated. The terms "illustrative" and "exemplary" are used to be examples with no indication of quality level. The terms "generally" and "approximately" refer to within engineering and/or manufacturing limits and/or within user measurement capabilities, unless otherwise indicated. Like numbers refer to like elements throughout.

In various embodiments, methods, apparatuses, systems, computer program products, and/or the like for generating and providing signals and noise mitigation circuitry for a quantum computing system. For example, a signal may be generated (e.g., by a signal generator) and applied to an electrical component (e.g., electrode) of a system. Application of the signal to the electrical component may cause the system to perform a function. In various embodiments, depending on the signal applied to the electrical component, the system may be configured to perform a variety of functions. In an example embodiment, different functions of the variety of functions may have different requirements regarding the amount of noise and/or the frequency of noise in the applied signal that can be tolerated. In various embodiments, a gain stage may be used to amplify a signal and/or a filter stage may be used to filter a signal (e.g., generated by the signal generator) prior to the signal being applied to the electrical component of the system. A filter stage may include an active filter, a passive filter, or an active filter and a passive filter. An active filter is a filter that may be comprised of active components (e.g., op-amps, transistors, etc.) and have a response that is determined from these components. Additionally, an active filter may be a dynamic filter, which may have an operating response that may be changed dynamically (e.g., during operation of the system). A passive filter is a filter using only passive components (e.g., resistors, capacitors, inductors, etc.) with a response that is determined from these components.

In an example embodiment, the system is a quantum computer. For example, the system may a trapped ion quantum computer comprising an ion trap comprising a plurality of electrodes. Application of signals (e.g., voltage signals) to the electrodes of the quantum computer may cause the ion trap to perform various functions corresponding to moving or maintaining atomic objects (e.g., ions, atoms, and/or the like) trapped within the ion trap, which may be trapped at various locations within the ion trap. For example, one function may be transporting atomic objects from one location within the ion trap to another location in the ion trap. Atomic objects in trapped ion quantum computers are physically moved around the traps by use of signals (e.g., waveforms) generated by a signal generator (e.g., an arbitrary waveform generator (AWG)) and applied to electrical components (e.g., electrodes) of the trap. To move these ions quickly the AWG requires a very fast update rate. The control circuitry for the generation of signals also controls other gate functions, including maintaining an atomic object in a particular location within the ion trap so that quantum logic gate may be performed on the atomic object, causing two atomic objects to swap positions within the ion trap, cause two atomic objects to move close together, cause two atomic objects that are close together move apart from one another, and/or the like.

Each of the functions may be associated with function-specific tolerances (e.g., noise tolerances, heat tolerances). Based on, for example, the function-specific noise tolerances corresponding to a function, the function may be assigned a particular response. Further, during gating, the voltage at the electrode must be very stable and have a very low noise spectral density (NSD) in order to maintain high fidelity of the gating operation.

Exemplary Quantum Computer Comprising an Ion Trap

In an example embodiment, the system is or comprises an atomic object confinement apparatus (also referred to as a confinement apparatus herein). In an example embodiment, the confinement apparatus is an ion trap (e.g., a surface ion trap). For example, the ion trap may comprise a plurality of electrodes configured to receive electrical signals (e.g., voltages) so as to generate a potential field that controls the movement of one or more atomic objects (e.g., ions) within the ion trap.

Various functions performed to control the movement of the one or more atomic objects may have different requirements. An example of a requirement may be to limit the noise in an electrical signal applied to the electrodes, which may or may not relate to noise in the electric and/or magnetic field generated by applying the electrical signal to an electrode. For example, the noise requirements for performing a transport function, wherein an atomic object is moved from one location in the ion trap to another location in the ion trap, may be a first noise requirement and the noise requirements for maintaining an atomic object at a particular location within the ion trap (e.g., so that a gate operation of a quantum computer for which the atomic object is a qubit may be performed) may be a second noise requirement. In an example embodiment, the first noise requirement and the second noise requirement may be different. For example, when performing the transport function, performance of the function may be sensitive to noise at frequencies around 1 MHz. In another example, when performing the maintaining function (e.g., maintaining the atomic object at a particular location within the ion trap so that a quantum logic gate may be executed on the atomic object), performance of the function may be sensitive to noise at frequencies around 250 kHz. Thus, performing the transport function using the noise requirements configured to optimize performance of the maintaining function, leads to decreased performance of the transport function. For example, performing the transport function using the noise requirements configured to optimize performance of the maintaining function decreases the speed and/or bandwidth with which the transport function may be performed. Another example of a requirement may be to limit the heat generated and/or experienced by atomic objects within the confinement apparatus and/or electrical components of the system, which may require the heat generated by and/or through operation of the noise mitigation circuitry, or other circuitry in the quantum computer, to be optimized or reduced. In exemplary embodiments, heat generated by the noise mitigation circuitry may be optimized or reduced by shaping or conditioning an electrical signal, including by using a pre-distorted signal.

FIG. 1 provides a schematic diagram of an example quantum computer system 100 comprising a confinement apparatus (e.g., ion trap 70), in accordance with an example embodiment. In various embodiments, the quantum computer system 100 comprises a computing entity 10 and a quantum computer 110. In various embodiments, a computing entity 10 is configured to allow a user to provide input to the quantum computer 110 (e.g., via a user interface of the computing entity 10) and receive, view, and/or the like output from the quantum computer 110. In various embodiments, the quantum computer 110 comprises a controller 30, a cryostat and/or vacuum chamber 40 enclosing a confinement apparatus (e.g., ion trap 70), and one or more manipulation sources 60. In an example embodiment, the one or more manipulation sources 60 may comprise one or more lasers (e.g., optical lasers, microwave sources, and/or the like). Beams, pulses, fields, and/or the like generated by the manipulation sources 60 may be provided to the ion trap 100 via one or more optical paths 66 (e.g., 66A, 66B, 66C) in an example embodiment. In various embodiments, the one or more manipulation sources 60 are configured to manipulate and/or cause a controlled quantum state evolution of one or more atomic objects within the confinement apparatus. For example, in an example embodiment, wherein the one or more manipulation sources 60 comprise one or more lasers, the lasers may provide one or more laser beams to the confinement apparatus within the cryostat and/or vacuum chamber 40. In various embodiments, the quantum computer 110 comprises one or more voltage sources 50. For example, the voltage sources 50 may comprise a plurality of voltage drivers and/or voltage sources and/or at least one RF driver and/or voltage source. For example, the voltage sources 50 may comprise one or more signal generators, such as, for example, signal generator 410 of FIG. 4. The voltage sources 50 may be electrically coupled to the corresponding potential generating elements of the confinement apparatus (e.g., ion trap 70) via, for example, one or more stages of electrical circuitry (e.g., gain stage, a filter stage, and/or a sample stage), which may be in series or parallel to other stages. The gain stage and/or the filter stage may shape the signal(s) being applied to the electrodes of an ion trap that traps atomic objects used as the qubits of the quantum computer 110.

Exemplary Controller

In various embodiments, a confinement apparatus (e.g., ion trap 70) is incorporated into a quantum computer 110. In various embodiments, a quantum computer 110 further comprises a controller 30 configured to control various elements of the quantum computer 110. In various embodiments, the controller 30 may be configured to control the voltage sources 50, cryogenic system, and/or vacuum system controlling the temperature and pressure within the cryostat and/or vacuum chamber 40, manipulation sources 60, and/or other systems controlling various environmental conditions (e.g., temperature, humidity, pressure, and/or the like) within the cryostat and/or vacuum chamber 40 and/or configured to manipulate and/or cause a controlled evolution of quantum states of one or more atomic objects within the confinement apparatus. For example, the controller 30 may cause a controlled evolution of quantum states of one or more atomic objects within the confinement apparatus to execute a quantum circuit and/or algorithm. In various embodiments, the atomic objects confined within the confinement apparatus are used as qubits of the quantum computer 110.

Figure 2:
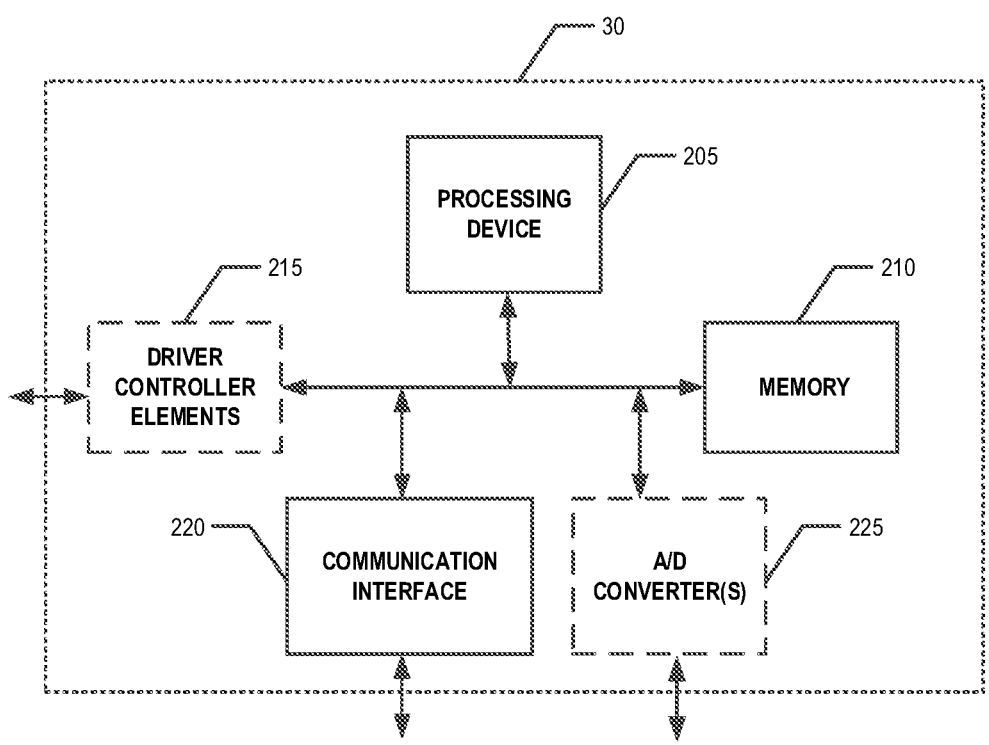
FIG. 2 is a schematic diagram of an example controller of a quantum computer according to various embodiments.

As depicted in FIG. 2, in various embodiments, the controller 30 may comprise various controller elements including processing elements 205, memory 210, driver controller elements 215, a communication interface 220, analog-digital converter elements 225, and/or the like. For example, the processing elements 205 may comprise programmable logic devices (PLDs), complex PLDs (CPLDs), microprocessors, coprocessing entities, application-specific instruction-set processors (ASIPs), integrated circuits, application specific integrated circuits (ASICs), field programmable gate arrays (FPGAs), programmable logic arrays (PLAs), hardware accelerators, other processing devices and/or circuitry, and/or the like. The term circuitry may refer to an entirely hardware embodiment or a combination of hardware and computer program products. In an example embodiment, the processing element 205 of the controller 30 comprises a clock and/or is in communication with a clock.

For example, the memory 210 may comprise non-transitory memory such as volatile and/or non-volatile memory storage such as one or more of as hard disks, ROM, PROM, EPROM, EEPROM, flash memory, MMCs, SD memory cards, Memory Sticks, CBRAM, PRAM, FeRAM, RRAM, SONOS, racetrack memory, RAM, DRAM, SRAM, FPM DRAM, EDO DRAM, SDRAM, DDR SDRAM, DDR2 SDRAM, DDR3 SDRAM, RDRAM, RIMM, DIMM, SIMM, VRAM, cache memory, register memory, and/or the like. In various embodiments, the memory 210 may store qubit records corresponding the qubits of quantum computer (e.g., in a qubit record data store, qubit record database, qubit record table, and/or the like), a calibration table, an executable queue, computer program code (e.g., in a one or more computer languages, specialized controller language(s), and/or the like), and/or the like. In an example embodiment, execution of at least a portion of the computer program code stored in the memory 210 (e.g., by a processing element 205) causes the controller 30 to perform one or more steps, operations, processes, procedures and/or the like described herein for applying signals to electrodes of the ion trap 70 for performance of a function that corresponds to the signals.

In various embodiments, the driver controller elements 215 may include one or more drivers and/or controller elements each configured to control one or more drivers. In various embodiments, the driver controller elements 215 may comprise drivers and/or driver controllers. For example, the driver controllers may be configured to cause one or more corresponding drivers to be operated in accordance with executable instructions, commands, and/or the like scheduled and executed by the controller 30 (e.g., by the processing element 205). In various embodiments, the driver controller elements 215 may enable the controller 30 to operate a manipulation source 60. In various embodiments, the drivers may be laser drivers; vacuum component drivers; drivers (e.g., voltage sources 50) for controlling the flow of current and/or voltage applied to electrodes used for maintaining and/or controlling the ion trapping potential of the ion trap 70; drivers for controlling the operating response of one or more dynamic filters (e.g., filter drivers, which may be controlled by the controller to activate circuitry (e.g., switches or attenuators) of the filter stage to select a response); cryogenic and/or vacuum system component drivers; and/or the like. In various embodiments, the controller 30 may comprise one or more analog-to-digital converter elements 225 configured to receive signals from one or more optical receiver components, calibration sensors, and/or the like. For example, in various embodiments, the controller 30 comprises means for communicating and/or receiving signals from one or more optical receiver components such as cameras, MEMs cameras, CCD cameras, photodiodes, photomultiplier tubes, and/or the like.

In various embodiments, the controller 30 may comprise a communication interface 220 for interfacing and/or communicating with a computing entity 10. For example, the controller 30 may comprise a communication interface 220 for receiving executable instructions, command sets, and/or the like from the computing entity 10 and providing output received from the quantum computer 110 (e.g., from an optical collection system) and/or the result of a processing the output to the computing entity 10. In various embodiments, the computing entity 10 and the controller 30 may communicate via a direct wired and/or wireless connection and/or one or more wired and/or wireless networks 20.

Exemplary Computing Entity

Figure 3:
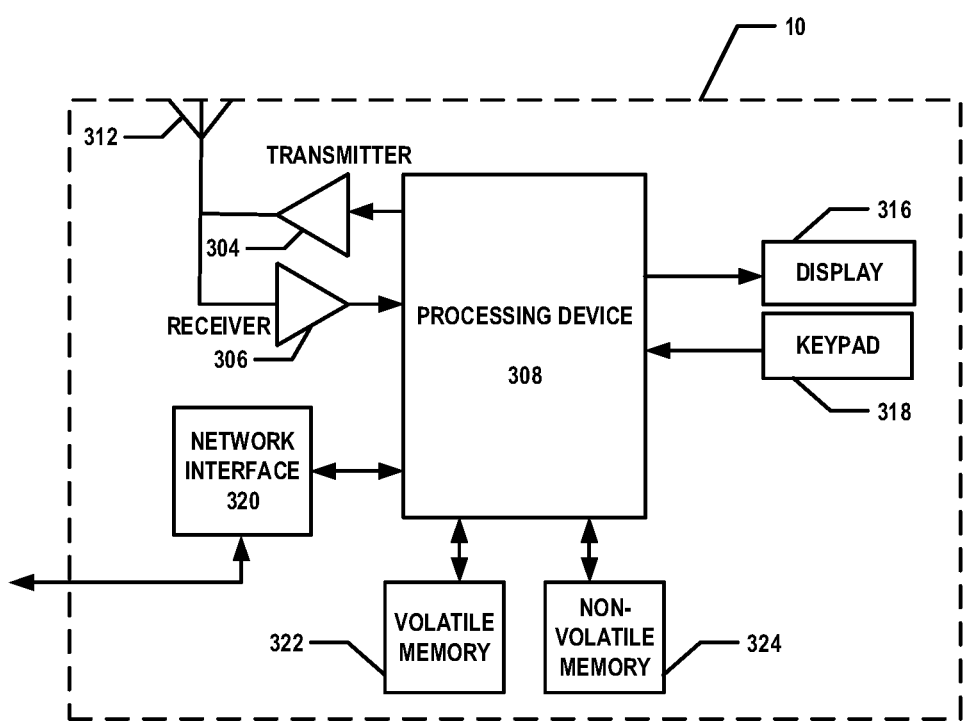
FIG. 3 is a schematic diagram of an example computing entity of a quantum computer system that may be used in accordance with an example embodiment.

FIG. 3 provides a schematic diagram of an exemplary computing entity 10 that may be used in conjunction with embodiments of the present invention. In various embodiments, a computing entity 10 is configured to allow a user to provide input to the quantum computer 110 (e.g., via a user interface of the computing entity 10) and receive, display, analyze, and/or the like output from the quantum computer 110. The computing entity 10 may be in communication with the controller 30 of the quantum computer 110 via one or more wired or wireless networks 20 and/or via direct wired and/or wireless communications. In an example embodiment, the computing entity 10 may translate, configure, format, and/or the like information/data, quantum computing algorithms, and/or the like into a computing language, executable instructions, command sets, and/or the like that the controller 30 can understand and/or implement.

As shown in FIG. 3, a computing entity 10 can include an antenna 312, a transmitter 304 (e.g., radio), a receiver 306 (e.g., radio), and a processing element 308 that provides signals to and receives signals from the transmitter 304 and receiver 306, respectively. The signals provided to and received from the transmitter 304 and the receiver 306, respectively, may include signaling information/data in accordance with an air interface standard of applicable wireless systems to communicate with various entities, such as a controller 30, other computing entities 10, and/or the like. In this regard, the computing entity 10 may be capable of operating with one or more air interface standards, communication protocols, modulation types, and access types. For example, the computing entity 10 may be configured to receive and/or provide communications using a wired data transmission protocol, such as fiber distributed data interface (FDDI), digital subscriber line (DSL), Ethernet, asynchronous transfer mode (ATM), frame relay, data over cable service interface specification (DOCSIS), or any other wired transmission protocol. Similarly, the computing entity 10 may be configured to communicate via wireless external communication networks using any of a variety of protocols, such as general packet radio service (GPRS), Universal Mobile Telecommunications System (UMTS), Code Division Multiple Access 2000 (CDMA2000), CDMA2000 1× (1×RTT), Wideband Code Division Multiple Access (WCDMA), Global System for Mobile Communications (GSM), Enhanced Data rates for GSM Evolution (EDGE), Time Division-Synchronous Code Division Multiple Access (TD-SCDMA), Long Term Evolution (LTE), Evolved Universal Terrestrial Radio Access Network (E-UTRAN), Evolution-Data Optimized (EVDO), High Speed Packet Access (HSPA), High-Speed Downlink Packet Access (HSDPA), IEEE 802.11 (Wi-Fi), Wi-Fi Direct, 802.16 (WiMAX), ultra wideband (UWB), infrared (IR) protocols, near field communication (NFC) protocols, Wibree, Bluetooth protocols, wireless universal serial bus (USB) protocols, and/or any other wireless protocol. The computing entity 10 may use such protocols and standards to communicate using Border Gateway Protocol (BGP), Dynamic Host Configuration Protocol (DHCP), Domain Name System (DNS), File Transfer Protocol (FTP), Hypertext Transfer Protocol (HTTP), HTTP over TLS/SSL/Secure, Internet Message Access Protocol (IMAP), Network Time Protocol (NTP), Simple Mail Transfer Protocol (SMTP), Telnet, Transport Layer Security (TLS), Secure Sockets Layer (SSL), Internet Protocol (IP), Transmission Control Protocol (TCP), User Datagram Protocol (UDP), Datagram Congestion Control Protocol (DCCP), Stream Control Transmission Protocol (SCTP), HyperText Markup Language (HTML), and/or the like.

Via these communication standards and protocols, the computing entity 10 can communicate with various other entities using concepts such as Unstructured Supplementary Service information/data (USSD), Short Message Service (SMS), Multimedia Messaging Service (MMS), Dual-Tone Multi-Frequency Signaling (DTMF), and/or Subscriber Identity Module Dialer (SIM dialer). The computing entity 10 can also download changes, add-ons, and updates, for instance, to its firmware, software (e.g., including executable instructions, applications, program modules), and operating system.

The computing entity 10 may also comprise a user interface device comprising one or more user input/output interfaces (e.g., a display 316 and/or speaker/speaker driver coupled to a processing element 308 and a touch screen, keyboard, mouse, and/or microphone coupled to a processing element 308). For instance, the user output interface may be configured to provide an application, browser, user interface, interface, dashboard, screen, webpage, page, and/or similar words used herein interchangeably executing on and/or accessible via the computing entity 10 to cause display or audible presentation of information/data and for interaction therewith via one or more user input interfaces. The user input interface can comprise any of a number of devices allowing the computing entity 10 to receive data, such as a keypad 318 (hard or soft), a touch display, voice/speech or motion interfaces, scanners, readers, or other input device. In embodiments including a keypad 318, the keypad 318 can include (or cause display of) the conventional numeric (0-9) and related keys (#, *), and other keys used for operating the computing entity 10 and may include a full set of alphabetic keys or set of keys that may be activated to provide a full set of alphanumeric keys. In addition to providing input, the user input interface can be used, for example, to activate or deactivate certain functions, such as screen savers and/or sleep modes. Through such inputs the computing entity 10 can collect information/data, user interaction/input, and/or the like.

The computing entity 10 can also include volatile storage or memory 322 and/or non-volatile storage or memory 324, which can be embedded and/or may be removable. For instance, the non-volatile memory may be ROM, PROM, EPROM, EEPROM, flash memory, MMCs, SD memory cards, Memory Sticks, CBRAM, PRAM, FeRAM, RRAM, SONOS, racetrack memory, and/or the like. The volatile memory may be RAM, DRAM, SRAM, FPM DRAM, EDO DRAM, SDRAM, DDR SDRAM, DDR2 SDRAM, DDR3 SDRAM, RDRAM, RIMM, DIMM, SIMM, VRAM, cache memory, register memory, and/or the like. The volatile and non-volatile storage or memory can store databases, database instances, database management system entities, data, applications, programs, program modules, scripts, source code, object code, byte code, compiled code, interpreted code, machine code, executable instructions, and/or the like to implement the functions of the computing entity 10.

Exemplary Noise Mitigation Circuitry

Figure 4:
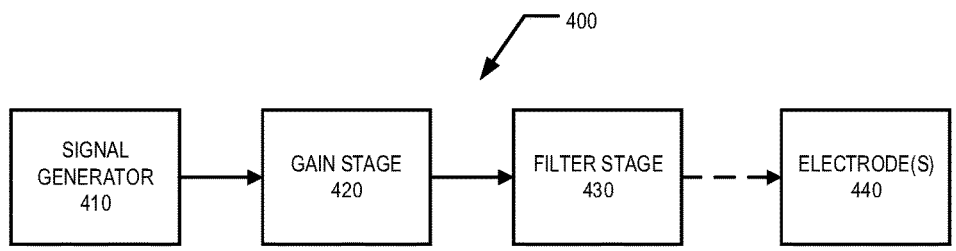
FIG. 4 is a schematic diagram of an example noise mitigation circuit according to various embodiments.

FIG. 4 illustrates an exemplary noise mitigation circuitry 400 in accordance with an exemplary embodiment. In various embodiments, a controller 30 may control one or more signal generators 410 to cause signals (e.g., voltage signals) to be generated and applied to electrical circuitry (e.g., noise mitigation circuitry 400) before being applied to electrical components (e.g., electrodes 440) of a system configured to perform multiple functions that have differing tolerances and/or requirements. In various embodiments, noise mitigation circuitry 400 may be provided for each electrode 440 of a quantum computer 110, such as noise mitigation circuitry 400 for each electrode 440 in a parallel arrangement (not depicted). In various other embodiments, noise mitigation circuitry 400 may provide a signal to multiple electrodes 440 of a quantum computer 110 (not depicted). The noise mitigation circuitry 400 may be configured to shape and/or condition a signal applied to one or more electrodes 440 of the ion trap 70.

As described above, the application of the signals to the electrodes 440 causes a potential field to be generated that may cause one or more functions to be performed on atomic objects captured within an ion trap 70. Different functions have different sensitivities (e.g., noise sensitivities) and therefore different tolerances and requirements (e.g., noise requirements). Further, the sensitivities, tolerances, or requirements may be related to the function to be performed. Thus, noise mitigation circuitry 400 may be used to shape and/or condition the signal, including mitigating noise, of one or more signal generators 410 that is applied to the electrodes 440. In an example embodiment, a signal generator 410 includes one or more waveform generators, which may be, for example, an arbitrary waveform generator (AWG) or a digital-to-analog converter (DAC).

Figure 5:
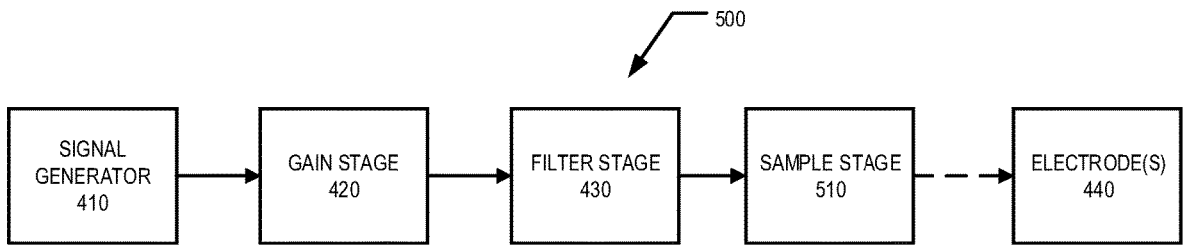
FIG. 5 is a schematic diagram of another example noise mitigation circuit according to various embodiments.

In an exemplary embodiment, and as depicted in FIG. 4, the noise mitigation circuitry 400 comprises a signal generator 410, a gain stage 420, and a filter stage 430. The gain stage 420 and/or the filter stage 430 may be omitted, in some embodiments. Alternatively, a stage may be omitted or an additional stage or additional stages may be added. For example, in another exemplary embodiment, and as depicted in FIG. 5, noise mitigation circuitry 500 may include a sample stage 510. In the exemplary embodiment of FIG. 5, the sample stage 510 is located after the filter stage, but in alternative embodiments it may be located elsewhere in the noise mitigation circuitry, such as prior to the filter stage 430 or prior to the gain stage 420 or in parallel to one or more other stages. In various embodiments, the gain stage 420 applies a gain to the signal generated by signal generator 410.

Figure 6:
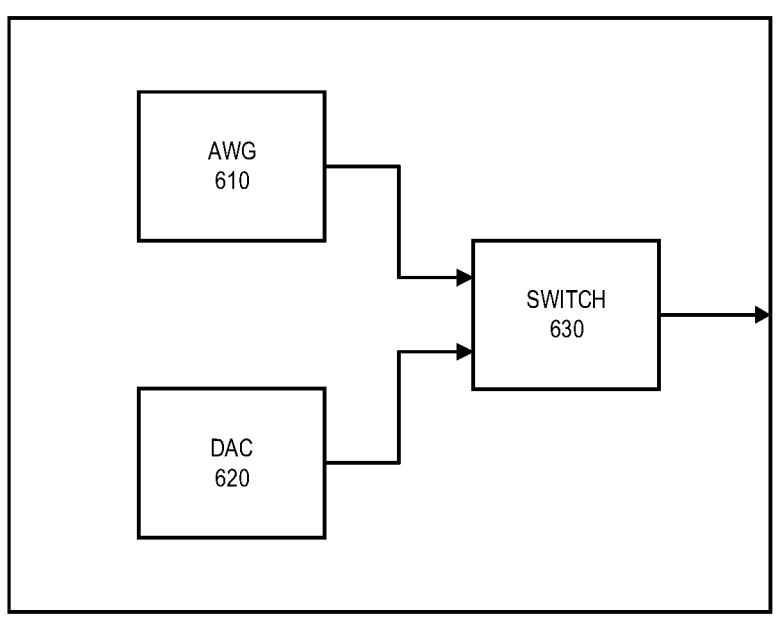
FIG. 6 is a schematic diagram of an exemplary signal generator according to various embodiments.

In various embodiments, the signal generator 410 may be comprised of one or more signal sources (e.g., voltage source, current source, arbitrary waveform generator, digital-to-analog converter, etc.). In an exemplary embodiment, and as depicted in FIG. 6, the exemplary signal generator 600 may be comprised of an arbitrary waveform generator (AWG) 610, a digital-to-analog converter 620, and a switch 630, each of which may be controlled by controller 30. In the exemplary embodiment of FIG. 6, controller 30 may provide a signal that causes AWG 610 to generate a signal and DAC 620 to generate a signal. A signal output by signal generator 610 may be generated by the controller causing switch 630 to select the signal from either AWG 610 or DAC 620. Thus signals from AWG 610 and DAC 620 may be selected to combine the signals from AWG 610 and DAC 620. The selection of the signals from either AWG 610 or DAC 620 or switching to generate a signal comprised of the output of each may, for example, depend on the current function or phase of the quantum computer 110.

In alternative embodiments not depicted, there are alternative manner of combining the output of, for example, AWG 610 and DAC 620. For example, switch 630 may be omitted and controller 30 could cause the generation of a signal from either one of AWG 610 or DAC 620, or both, to generate a signal to be the output of the signal generator. In alternative examples, a servo may be used to reference AWG 610 and DAC 620 (e.g., a traditional or a Deboo integrator circuit), a bias-T may be used, or a voltage summer may be used. Alternatively, or additionally, switch 630 may be replaced by, for example, a summer, divider, or average circuit that may be used to generate an output signal. Further, signal generator 600 may include more than two signal sources (not depicted), and multiple switches may be used along with summer, divider, or average circuits. Additionally, the controller may control the signals from AWG 610 and DAC 620 such that the signal generated as an output of signal generator 600 is pre-distorted and/or shaped, which may be based on measurements taken related to the noise mitigation circuitry or downstream circuitry. The combining of the signals from signal sources (e.g., AWG 610 and DAC 620) may not be combined equally or for equal amounts of time. For example, a switch 630 may pass the signal of AWG 610 at a greater percentage of the time (e.g., 75%) than the signal of DAC 620 (e.g., 25%). Further, the controller 30 may have either AWG 610 or DAC 620 not generate a signal.

By controlling how each signal source of signal generator 410 generates a signal, controller 30 may cause the signal generator 410 to generate a specific signal. The signal generated by signal generator 410 may thus be generated for the specific electrical circuitry and/or electrode that the signal is provided to.

Figure 7:
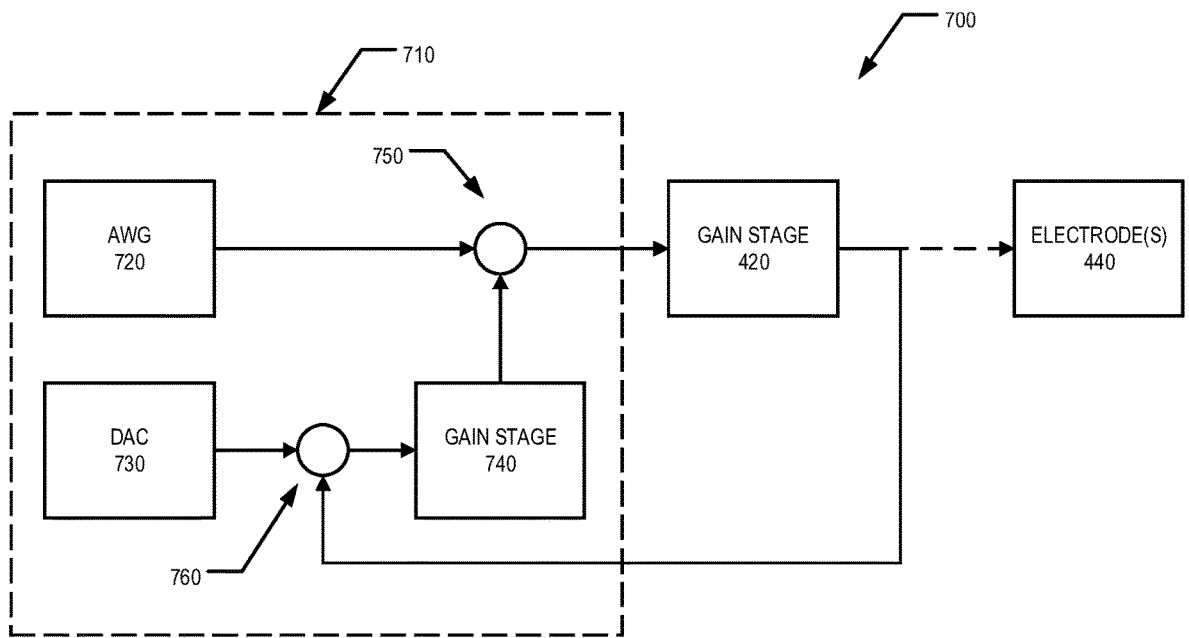
FIG. 7 is a schematic diagram of another exemplary signal generator according to various embodiments of the noise mitigation circuit.

FIG. 7 illustrates an additional embodiment of a signal generator 410, which is at reference number 710. Signal generator 710 comprises an AWG 720 and a DAC 730 as well as a gain stage 740. While not depicted in FIG. 7, a gain stage could be placed after AWG 720 or both AWG 720 and DAC 730 could have their own gain stages within the signal generator 710. Also depicted in FIG. 7 are circuitry 750 and circuitry 760, which may be the same circuitry or may be distinct. For example, circuitry 750 and 760 could be electrical junctions or, alternatively, each could be a switch or other circuitry for combining two inputs into one output (e.g., as depicted in FIG. 7 with circuitry 760). As depicted in FIG. 7, an input into circuitry 760 may be the output of a later stage of the noise mitigation circuitry, such as the output of gain stage 420 or the input to electrodes 440, which are the same signal for FIG. 7 but may be different signals, for example, in FIG. 4 or 5.

In various embodiments, a filter stage 430 may comprise multiple (e.g., two or more) filters (not depicted in FIG. 7), and the filters may be of the same or different types (e.g., low-pass filter, high-pass, band-pass, and/or band-stop filters). Further, each filter may be of a the singly terminated type with a specific filter response (e.g., a Butterworth, Bessel, Chebyshev, Elliptic, Legrende, etc.). Various filters (e.g., having various responses) may be used in various embodiments. The filters may be active filters or passive filters.

Figure 8:
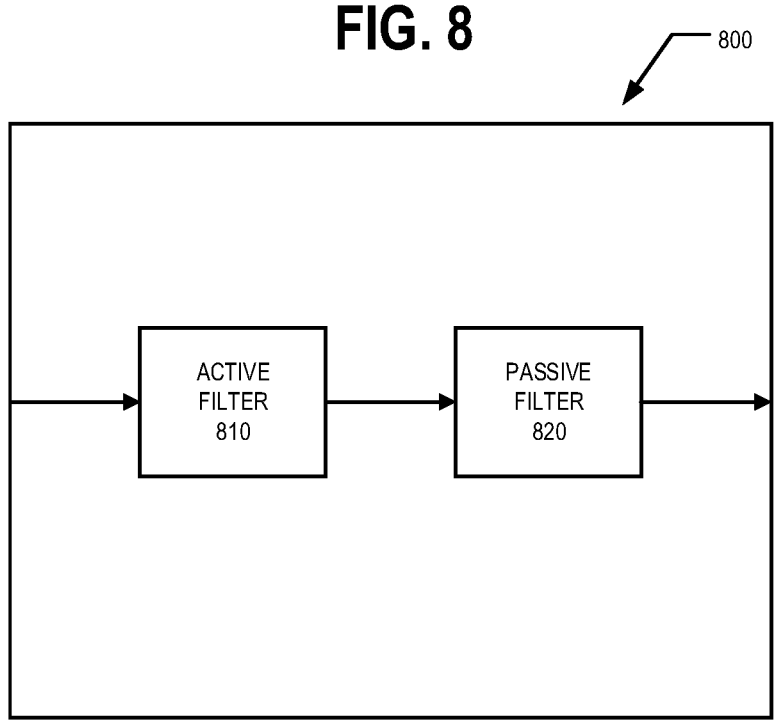
FIG. 8 is a schematic diagram of an exemplary filter stage in accordance with various embodiments.

In an exemplary embodiment, such as depicted in FIG. 8, the exemplary filter stage 800 may be comprised of an active filter 810 and a passive filter 820. While a single active filter 810 and single passive filter 820 are depicted in FIG. 8, in exemplary embodiments there are one or more active filters and one or more passive filters in the filter stage. Further, while not depicted, the active filters and passive filters may be located is various orders (e.g., a passive filter before an active filter).

The filtering of the signal output by filter stage 800 may, for example, be determined by the output of active filter 810 and of passive filter 820. The filtering of filter stage 800 will be to have the signal output from filter stage 800 meet the requirements and tolerances of, for example, the electrode(s) 440, which may be a target filter function. The target filter function may be comprised of its constituent poles, and a portion of the poles are assigned to each filter (e.g., active filter 810, passive filter 820). In an exemplary embodiment, the real pole and the most underdamped set of poles are assigned to the passive filter 820 and the remainder of the poles are assigned to the active filter 810. In this embodiment, this assignment of poles may prevent the underdamped response from clipping the operation amplifier and reduces non-linear behavior. From the assignment of poles, the active filter 810 and the passive filter 820 may be determined. In an alternative embodiment, the poles assigned to the passive filter may be the low frequency poles. Further, in an exemplary embodiment, a pre-distorted signal from signal generator 410 may be generated based on a measurement from the filter stage 800, which may include the pre-distorted signal including a portion of the signal that will be removed by the filter. The pre-distorted signal may be generated to have a portion removed due to the capabilities of the signal source(s) of signal generator 410.

In an exemplary embodiment, the active filter 810 may provide noise shaping and the passive filter 820 may remove residual noise that may be from the operational amplifiers of the active filter 810. The design of components comprising the active filter may include, for example, resistors that minimize noise. Additionally, a buffer (not depicted) may be used on the input and/or the output of the active filter 810. A buffer at the input may, for example, address low impedance of the active filter 810. A buffer at the output may, for example, be used to drive the passive section.

In an exemplary embodiment, a passive filter 820 may be designed for infinite output impedance to drive the electrodes, and the input impedance may be chosen for inductor values to match a desired value.

Thus, the controller 30 may control a signal generator 410 to provide a particular signal. The controller 30 may also control a filter stage 430 to control the operating response of a filter. The filter stage 430 may receive the signal generated by the signal generator 410 and filter the signal in accordance with the operating response selected by the controller 30. The filtered signal is then provided to the electrodes 440 so that the resulting potential field may be used to perform a function. Moreover, the filtered signal provided to the electrodes 440 has an appropriate profile within the required tolerances (e.g., noise tolerance) for the function to be performed via potential field resulting from the application of the signal to the electrodes 440.

In an exemplary embodiment, such as depicted in FIG. 5, a sample stage 510 may be used with a signal prior to being provided to an electrode. The signal input into the sample stage may have more noise than desired, and noise on an electrode may degrade the fidelity of a gate performed in the vicinity of the electrode. In an embodiment that omitted a gain stage 420 and/or a filter stage 430, for example, an output of a signal generator may have more noise than that of a precision operational amplifier. For example, the output of a DAC may have noise on the order of 10s to 100s of nanovolts, whereas a precision operational amplifier may have noise of the order of a few nanovolts. In some embodiments, the use of a sample stage 510 may reduce the detrimental effects of instrument noise spectral density (NSD) on the electrodes 440 and may also remove the need for larger filters or additional filters. In some embodiments, the output of the sample stage 510 may be to an analog-to-digital converter, which may assist with sampling by, for example, acting as a buffer. In some embodiments, a sample stage may be a buffer to reduce noise or circuit complexity. In some embodiments, the noise reduced may be noise generated by a signal generator.

Figure 9:
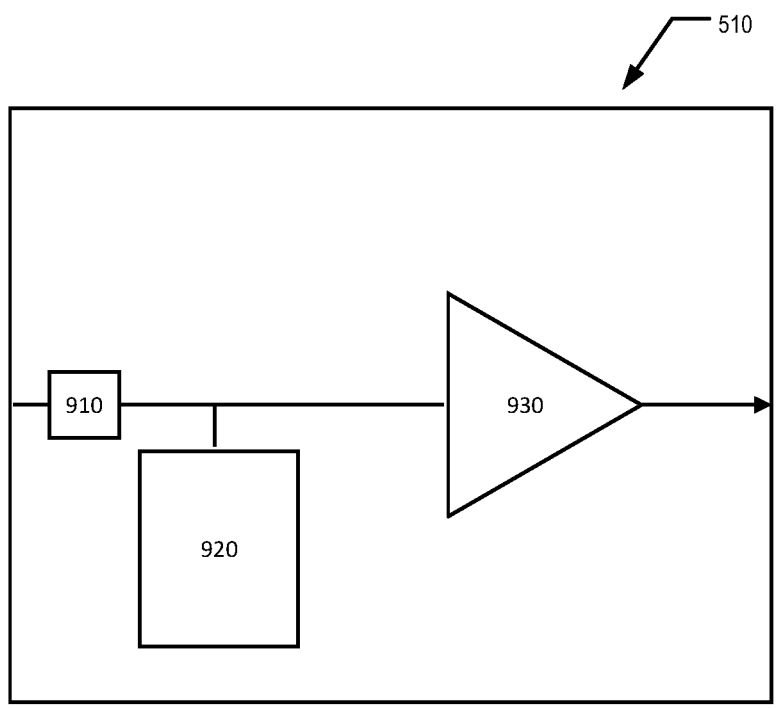
FIG. 9 is a schematic diagram of an exemplary sample stage in accordance with various embodiments.

FIG. 9 illustrates a schematic of an example sample stage 510. In an example embodiment, the sample stage 510 comprises a switch 910, a capacitor 920 (which may be grounded), and an operational amplifier 930. The switch 910 may be opened or closed based on, for example, a mode or operation or function (e.g., transport or gating). The switch 910 may be, for example, a JFET (not depicted). When the JFET is switched on, the capacitor 920 may be charged. Once the capacitor is charged, the JFET closes the circuit and the operational amplifier 930 acts as a buffer for the capacitor 920 holding the voltage of the capacitor at the output of the sample stage 510. The capacitor may be charged by a voltage source such as, for example, a DAC, which may generate a signal based on input from controller 30.

Feedback Circuitry

The bandwidth of signal applied to the electrodes may be limited by the noise mitigation circuitry. In exemplary embodiments, to overcome the bandwidth limitation a signal generated by the signal generator 410 may be shaped, such as with pre-distortion. This may, for example, overcome filter delays and/or attenuation. Further, signals may generate unwanted heat that reduces the processing of the quantum circuit and the use of a pre-distorted signal may reduce this heat. In an exemplary embodiment, feedback circuitry allows for the determination of a pre-distorted signal, such as one that may reduce the heat generated.

Figure 10:
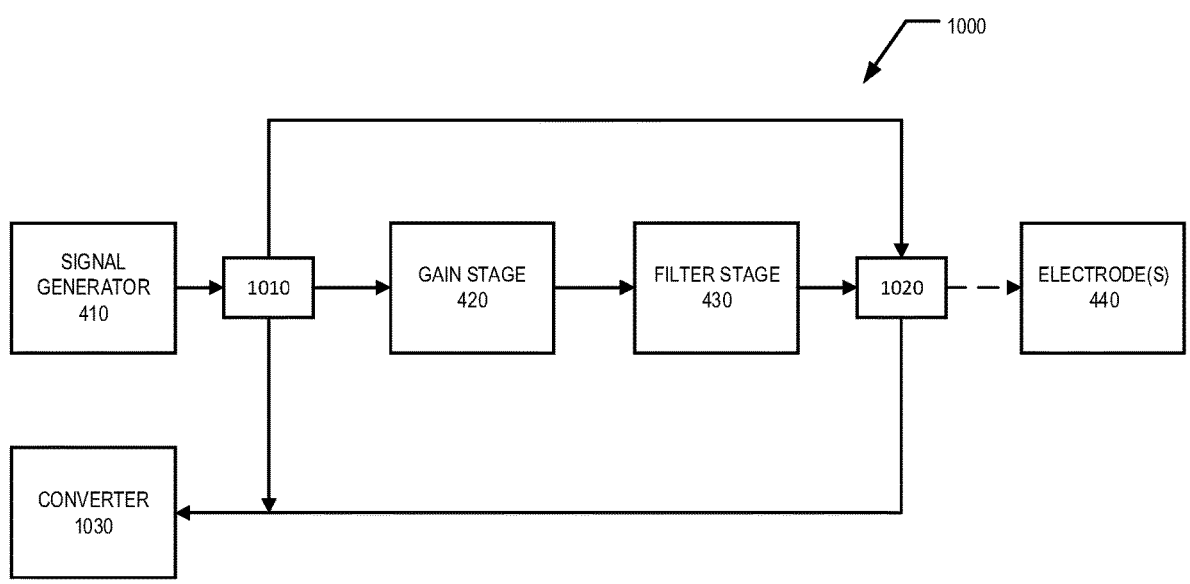
FIG. 10 is schematic diagram of an exemplary calibration circuit in accordance with various embodiments.

FIG. 10 illustrates a schematic of exemplary noise mitigation circuitry including feedback circuitry 1000. In the embodiment depicted in FIG. 10, the exemplary noise mitigation circuitry including feedback circuitry 1000 may be comprised of additional switches (e.g., switch 1010 and switch 1020) and a converter 1030. In an exemplary embodiment, converter 1030 is an analog-to-digital converter. The switches 1010 and 1020 may be, for example, one-to-N switches (e.g., one input to two outputs) or N-to-one switches (e.g., two inputs to one output). Additionally, switch 1010 or 1020 could be a combination of one or more switches, such as an N-to-one switch and a one to N-switch, which would allow for one of multiple inputs to be selected and output on one of N outputs. The use of switches allows for one or more portions of the noise mitigation circuitry to be isolated, which may be used in calibrating, characterizing, or diagnosing the noise mitigation circuitry. This may be done by the output of the switches, as depicted in FIG. 10, being input to a converter 1030. The signal input into converter 1030 may be converted from an analog signal to a digital signal in order to, for example, determine characteristics about the noise mitigation circuitry that allows for the calibration of signals output by signal generator 410 or diagnosing the noise mitigation circuitry.

While FIG. 10 depicts two switches (switch 1010 and switch 1020), additional switches may be present to isolate additional circuitry. For example, referring to FIG. 10, a switch may be located between gain stage 420 and filter stage 430 and allow for the isolation for filter stage 430. As a further example, if a sample stage (not depicted in FIG. 10) is present, switches before, after, or before and after the sample stage may be used to isolate the sample stage. A sample stage could be located, for example, after filter stage 430 but before switch 1020 of FIG. 10.

In an exemplary embodiment, a signal generator 410 may include more than one signal source. Controller 30 may generate separate signals from each of the single sources of signal generator 410, and switch 1010 and switch 1020 may be used to isolate portions of the noise mitigation circuitry to direct the signal through or around specific stages and/or components of the noise mitigation circuitry for the determination of characteristics about each signal generated separately or in different combinations (e.g., a duty cycle having a first 75% being from a first signal source and a second 25% being from a second signal source).

Figure 11:
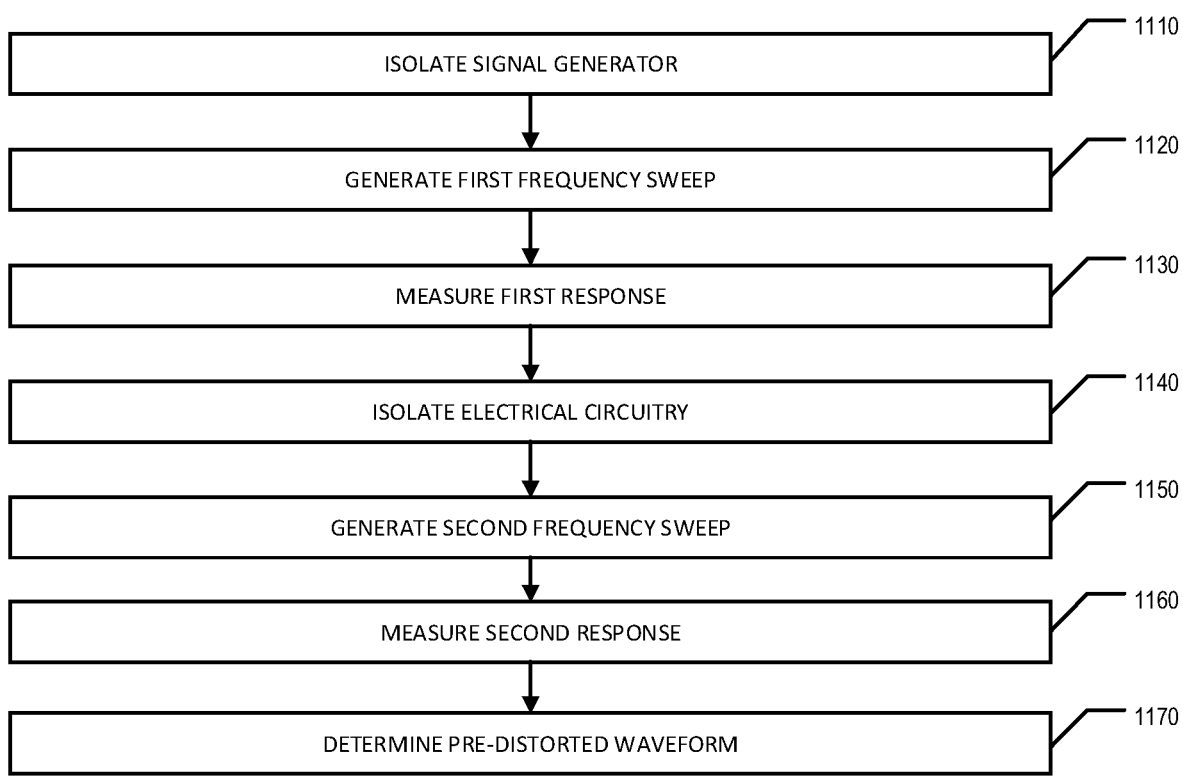
FIG. 11 is a flowchart of various processes, procedures, and/or operations that may be performed by a controller of a quantum computer, for example, to determine a pre-distorted waveform.

In an exemplary calibration routine, depicted in FIG. 11, a signal to be output by signal generator 410 may be calibrated by measuring the response of the noise mitigation circuitry including feedback circuitry 1000 to determine a pre-distorted wave-form to be generated by signal generator 410 in order to overcome any bandwidth limitations of the circuit, minimize noise, and minimize heat.

FIG. 11 provides a flowchart illustrating example processes, procedures, operations, and/or the like that may be performed by a controller 30, for example, to determine a pre-distorted waveform that may be generated by signal generator 410. For the sake of clarity, we focus on the application of a signal with dynamically shaped noise to a single electrode 440. However, as should be understood, a system may comprise a plurality of signal generators 410, a plurality of gain stages, filter stages, and/or sample stages such that signals with the pre-distorted waveform and/or of different pre-distorted waveforms may be provided to a plurality of electrodes 440 and/or other electrical components.

Starting at step/operation 1110, and using the exemplary noise mitigation circuitry including feedback circuitry 1000 of FIG. 10, the signal generator 410 may be isolated by operating switch 1010 such that the output of signal generator 410 is input into converter 1030.

At step/operation 1120, signal generator 410 may generate a first frequency sweep over a range of frequencies. The range of frequencies may be determined, for example, by the characteristics of the signal generator 410 or, alternatively, by the characteristics of another portion of the noise mitigation circuitry, such as the filter stage. For example, if the characteristics of the filter stage were such that only signals having frequencies under 10 kHz were allowed to pass, the first frequency sweep may have an upper limit of 10 kHz. Alternatively, there may be no limits to the frequencies in the frequency sweep other than whatever frequencies the signal generator 410 may generate.

At step/operation 1130, converter 1030 measures a first response to the first frequency sweep generated by signal generator 410. This first measurement by converter 1030 may be provided to controller 30.

At step/operation 1140, switches 1010 and 1020 may be operated to isolate the noise mitigation electrical circuitry. For example, switch 1010 may be operated to receive as an input the output of signal generator 410 and output that signal to gain stage 420, and switch 1020 may be operated to receive as input the output of filter stage 430 and output that signal to converter 1030. In this step in this example, the output of signal generator 410 is only transmitted to gain stage 420 and the output of filter stage 430 is only transmitted to converter 1030. In alternative examples, if there are more than one gain stage or more than one filter stage or a sample stage, switches could isolate each stage such that the output of each stage is provided to converter 1030.

Continuing with the example, and at step/operation 1150, signal generator 410 generates a second frequency sweep, which may be the same signal as the first frequency sweep. The second frequency sweep may or may not be limited based on the characteristics of the electrical circuitry, which was discussed above.

At step/operation 1160, converter 1030 measures a second response to the second frequency sweep generated by signal generator 410 and transmitted through, as depicted in FIG. 10, the switch 1010, gain stage 420, filter stage 430, and switch 1020. This second measurement by converter 1030 may be provided to controller 30, which may use the measurement. In some embodiments, the controller may analyze the second measurement (e.g., a frequency domain analysis), which may be used in further operations, such as in determining a pre-distorted waveform. Additionally, the signals being provided to converter 1030 may be small and an additional gain stage (not depicted) may be placed before converter 1030.

At step/operation 1170, the first measurement and the second measurement may be used to determine a pre-distorted waveform that may be used with the electrical circuitry in this example. For example, the second measurement may be divided by the first measurement to determine a frequency response of the gain stage 420 and filter stage 430, which in the example illustrated in FIG. 10, is the electrical circuitry that a signal passes through before being input to electrodes 440. The determined frequency response is an improvement over analytical or theoretical models of electrical circuits due to variations in the physical components used in the electrical circuitry. Thus the determined frequency response may be used to determine a pre-distorted waveform that may be used with the noise mitigation circuitry of FIG. 10 in order to generate a pre-distorted signal that mitigates the noise and heat that may be generated from signals generated from signal generator 410 passing through the noise mitigation circuitry and/or by the filtering, amplifying, and/or other conditioning of the signals generated from signal generator 410.

Figure 12:
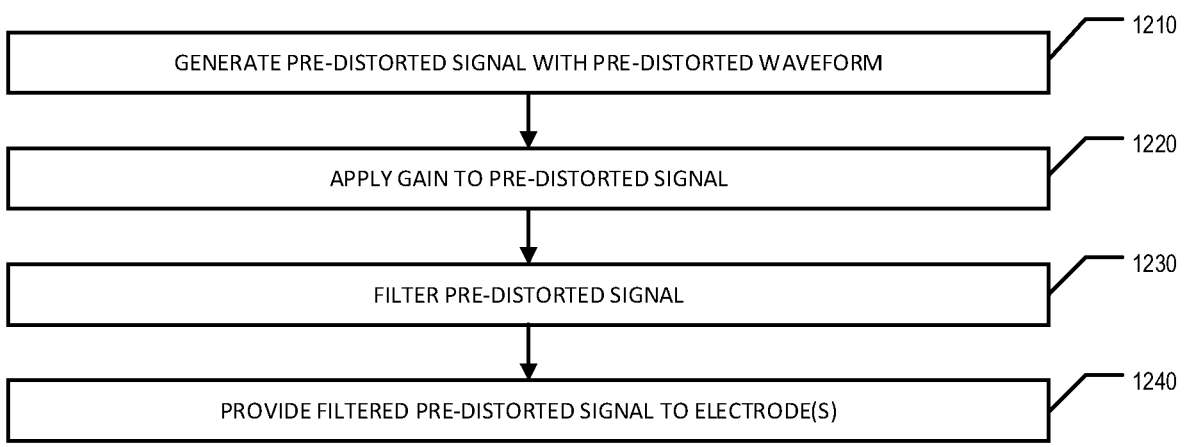
FIG. 12 is a flowchart of various processes, procedures, and/or operations that may be performed by a controller of a quantum computer, for example, to provide a filtered pre-distorted signal to electrode(s).

FIG. 12 is a flowchart of various processes, procedures, and/or operations that may be performed, for example, to provide a filtered pre-distorted signal to electrode(s). In an exemplary embodiment, after determining a pre-distorted waveform to apply, at step 1210, signal generator 410 generates a pre-distorted signal having the pre-distorted waveform. As step 1220, the pre-distorted signal is provided to gain stage 420, which applies a gain to the pre-distorted signal. At step 1230, the pre-distorted signal with a gain is provided to filter stage 430 to filter the signal. At step 1240, the filtered pre-distorted signal is provided to one or more electrodes 440. While FIG. 12 addresses a pre-distorted signal generated by signal generator 410, the same steps may be used in exemplary embodiments for providing a signal to one or more electrodes wherein the signal is not pre-distorted.

An alternative to the frequency sweeps described above for use with FIG. 11 is to use a DC voltage instead of a frequency sweep. Using a DC voltage may allow for the measurements taken by the ADC to be used to measure the noise spectral density of the noise mitigation circuitry. As another alternative, a pulse may be used instead of a frequency sweep. As another alternative, a signal may be a frequency sweep, a pulse, and/or a DC voltage.

In various alternative embodiments, the order of the portion of the noise mitigation circuitry to which a signal (e.g., frequency sweep) is applied may vary.

The feedback circuitry may additionally be used to check the health of the noise mitigation circuitry. By isolating stages, or portions of stages, and measuring the response over the isolated stage, the health of the stage may be determined. For example, if a component was damaged then the isolation of a stage from the noise mitigation circuitry may allow for measuring of a response for that stage and comparing the measured response to either an expected response (e.g., a theoretical response) or a previously measured response. This check of the health of the noise mitigation circuitry may allow for diagnostics. In some exemplary embodiments, such diagnostics may be automated and performed at regular intervals.

In additional embodiments, the feedback circuitry being used to perform time-domain reflectometry (TDR). TDR may allow for the measurement of a response, which may be indicative of an impedance, related to portions of the circuitry that otherwise may not be able to be accessed. Further, TDR may allow for measurement of a response from circuitry downstream of the noise mitigation circuitry (e.g., an electrode 440), which may provide feedback regarding the health of the noise mitigation circuitry or the downstream circuitry. Use of switches (e.g., switch 1010 and switch 1020 of FIG. 10) may be used to isolate some or all of the noise mitigation circuitry 400 to perform TDR. Isolating the noise mitigation circuitry may be beneficial for, among other reasons, isolating an amplifier (e.g., a gain stage 420). For example, the signal generator 410 may generate a pulse. The pulse may be sent through various stages (or portion of stages) of the noise mitigation circuitry 400, such as the gain stage 420 and/or the filter stage 430, or bypass the noise mitigation circuitry 400. As the pulse passes through the components (e.g., components in the stages or downstream circuitry), including connector junctions, reflections of the signal may be generated. The reflections may provide telemetry data when they are generated, which may be by, for example, an open or a damaged component or circuit. The amplitude and dispersion characteristics of the measured reflections will provide insight into the quality of the stages, the downstream circuitry, the components in the stages or downstream circuitry, and connections. Examples of these insights include impedance measurements as well as locations of where the reflections were generated (e.g., at a damaged component or circuit, an open circuit, or a component creating an open circuit).

In further additional embodiments, the feedback circuitry being used to measure the noise spectral density (NSD). For example, connecting the signal generator 410 through switch 1010 to converter 1030 with the output of the signal generator 410 set to a DC voltage signal, the NSD of the signal generator 410 may be measured. In a further embodiment, connecting the electrode 440 to converter 1030 (without connecting the signal generator 410 or the gain stage 420 or the filter stage 430) enables measurement of the NSD of the electrode 440. There may be more than one electrode 440 in the ion trap 70, and the circuitry providing signals to these additional electrodes may be in close physical proximity to the noise mitigation circuitry and/or electrode 440. The NSD measurement of the electrode 440 may, for example, measure if there is an unwanted signal radiating on to electrode 440 or for cross talk among circuits providing signals to other electrodes.

In alternative embodiments, the feedback circuitry may allow for use a frequency sweep to generate a response. For example, connecting the signal generator 410 through switch 1010 and switch 1020 to electrode 440 and to converter 1030 with the output of the signal generator 410 set to a frequency sweep, the response of the electrode (or other downstream circuitry) may be measured. The response, may, for example, measure variations in expected responses at certain frequencies. Such variations, for example, may be thermal fluctuations of components or circuitry.

Insights from checking the system health may allow for downtime to be minimized, which improves troubleshooting of the system. Alternatively, or additionally, checking the health may be performed during runtime such that insights that may be learned to address the health of the system while, for example, the system is taken down for maintenance or, as another example, portions of the system are isolated. Checking the health may allow for real-time waveform pre-distortion to address a response received from a check. Further, from the responses, a pre-distorted may be determined and generated to account for tolerances measured in the system (e.g., manufacturing tolerances) and to compensate for fluctuations caused during use (e.g., thermal fluctuations).

In alternative embodiments, noise in the noise mitigation circuitry, electrodes, or other downstream circuitry may fluctuate due to other equipment, such as test equipment or other electrical or mechanical systems in close proximity (e.g., in the same room or alternate part of the system). Health checks may reveal that the use of other systems causes noise, for example, in the system, such as in a component, a stage (e.g., gain stage 420), or at the electrodes 440. The feedback from the checking of the health, for example with TDR, NSD, or frequency sweeps, may be used to pre-distort a signal to compensate for noise created in the system. Additionally, or alternatively, the noise may be addressed by coordinating when the controller 30 may cause signal generator 410 to generate signals to, for example, turn the system off or cause noise mitigation circuitry or feedback circuitry to isolate a portion of the system experiencing the noise. For example, if an operation requires high fidelity at the electrodes, the system may be checked to determine that any noise is within an acceptable range (or alternatively not present) before a signal is generated.

Technical Advantages

Various embodiments provide technical solutions to the technical problem of generating and providing signals to a system that cause the system to perform different functions, wherein the different functions have different tolerances or requirements. For example, in the example system of the trapped ion quantum computer described above, when performing the transport function, performance of the function may be sensitive to noise, such as at frequencies around 1 MHz and/or when performing the maintaining function (e.g., maintaining the atomic object at a particular location within the ion trap so that a quantum logic gate may be executed on the atomic object), the performance of which may be sensitive to noise at frequencies around 250 kHz. Prior methods for noise shaping of the signals includes filtering all of the signals based on the noise tolerances of the function having the most stringent noise tolerances. However, performing the transport function using the noise requirements configured to optimize performance of the maintaining function, may lead to decreased performance of the transport function. For example, performing the transport function using the noise requirements configured to optimize performance of the maintaining function decreases the speed and/or bandwidth with which the transport function may be performed. Exemplary embodiments provided herein describe technical solutions to these technical problems by providing noise mitigation circuitry to provide signal to electrodes that meet noise requirements and tolerances required for multiple functions. Thus, example embodiments provide technical solutions that lead to improved system performance.

For example, to meet the low noise requirements of electrodes 440, a signal generator 410 may be comprised of more than one voltage source and the signal generator 410 may generate a signal by combining the output of each voltage source. This combination of the signals from more than one voltage source may reduce the noise generated by a system using one voltage source.

In another example, to meet the low noise requirements of electrodes 440, a filter stage 430 may be comprised of at least one active filter and at least one passive filter. This may provide improvements over a passive filter alone, which may have required inductors that either may be physically too large for the equivalent passive filter in the quantum computer 110 or may have too many parasitic losses and/or too large tolerances. This may also provide improvements over an active filter alone, which may have required operational amplifiers that generated too much residual noise for the required tolerances.

In another example, the use of feedback circuitry in the noise mitigation circuitry may allow for the determination of a pre-distorted waveform for a signal. The pre-distorted waveform may be determined from measurements taken from portions of the noise mitigation circuitry, which allows for the determination of the pre-distorted waveform to minimize the noise and/or heat generated from the providing of a signal to these portions of the noise mitigation circuitry.

CONCLUSION

Many modifications and other embodiments of the invention set forth herein will come to mind to one skilled in the That which is claimed:

1. A system for providing a signal to an electrode in an ion trap of a quantum computer, the system comprising:
   a signal generator configured to generate a first signal, wherein the first signal comprises a frequency sweep;
   a gain stage configured to amplify the signal, wherein an input to the gain stage is connected to an output of the signal generator;
   a filter stage configured to filter the signal, where an input to the filter stage is connected to an output of the gain stage;
   a converter configured to measure a response at an output of the filter stage in response to the first signal;
   wherein the signal generator is further configured to generate a second signal, wherein the second signal is pre-distorted with a determined pre-distorted waveform based on the response measured;
   wherein an electrode in an ion trap is configured to receive the second signal.

2. The system of claim 1, wherein the filter stage comprises an active filter and a passive filter.

3. The system of claim 1, wherein signal generator comprises a first digital-to-analog converter and a second digital-to-analog converter.

4. The system of claim 3, wherein the second digital-to-analog converter is configured to provide a DC offset voltage.

5. The system of claim 3, wherein the first digital-to-analog converter is configured to provide the pre-distorted second signal.

6. The system of claim 1, wherein the output of the signal generator connected to the input of the gain stage is connected through a switch, and wherein the switch switches between connecting to the input of the gain stage and connecting to the converter.

7. The system of claim 1, wherein the filter stage comprises a low pass filter.

8. The system of claim 1, wherein the ion trap is configured to have a plurality of ions trapped therein, and wherein at least some of the plurality of the ions trapped therein are used as qubits of the quantum computer.

9. A method for pre-distorting a signal generated by a signal generator of a quantum computer, the method comprising:
   causing, by a controller, a signal generator to generate a first signal, wherein the first signal comprises a frequency sweep over a plurality of frequencies;
   causing the first signal to be provided to noise mitigation circuitry, wherein the noise mitigation circuitry comprises a filter stage, and wherein the filter stage is configured to filter the first signal in accordance with a filter response to provide a filtered signal;
   measuring the filtered signal with a converter;
   causing the signal generator to generate a second signal, wherein the second signal is pre-distorted based on the measurement of the filtered signal;
   causing the second signal to be provided to an electrode of an ion trap of the quantum computer.

10. The method of claim 9, wherein the filter stage comprises an active filter and a passive filter.

11. The method of claim 9, wherein signal generator comprises a first digital-to-analog converter and a second digital-to-analog converter.

12. The method of claim 11, wherein the second digital-to-analog converter is configured to provide a DC offset voltage.

13. The method of claim 9, wherein the filter stage comprises a low pass filter.

14. The method of claim 9, wherein the filter stage comprises a filter having a Butterworth response.

15. The method of claim 9, wherein the ion trap is configured to have a plurality of ions trapped therein, and wherein at least some of the plurality of the ions trapped therein are used as qubits of the quantum computer.

16. A system for providing a signal to an electrode in an ion trap, the system comprising:
   a signal generator configured to generate a first signal, wherein the first signal comprises a frequency sweep;
   a gain stage configured to amplify the first signal, wherein an input to the gain stage is connected to an output of the signal generator;
   a filter stage configured to filter the first signal, where an input to the filter stage is connected to an output of the gain stage;
   a sample stage, where an input to the sample stage is connected to the output of the filter stage;
   a converter configured to measure a response at an output of the sample stage in response to the first signal;
   wherein the signal generator is further configured to generate a second signal, wherein the second signal is pre-distorted based on a measured response of the first signal;
   wherein the electrode in the ion trap is configured to receive the second signal.

17. The system of claim 16, wherein the filter stage comprises an active filter and a passive filter.

18. The system of claim 16, wherein signal generator comprises a first digital-to-analog converter and a second digital-to-analog converter.

19. The system of claim 16, wherein the filter stage comprises a low pass filter.

20. The system of claim 16, wherein the filter stage comprises a filter having a Butterworth response.

* * * * *